US012768864B2

(12) United States Patent

Hein et al.

(10) Patent No.: US 12,768,864 B2

(45) Date of Patent: Oct. 20, 2026

(54) DIFFERENTIAL SENSING ELEMENT PLACEMENT IN CURRENT SENSORS FOR HETEROGENEOUS STRAY FIELD IMMUNITY

(71) Applicant: Allegro MicroSystems, LLC, Manchester, NH (US)

(72) Inventors: Matthew Hein, Dallas, TX (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 166 days.

(21) Appl. No.: 18/769,477

(22) Filed: Jul. 11, 2024

(65) Prior Publication Data

US 2026/0016507 A1 Jan. 15, 2026

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC .......................... G01R 15/202; G01R 19/0092
See application file for complete search history.

(56) References Cited

U.S. PATENT DOCUMENTS

| | | | |
|---|---|---|---|
| 4,746,862 | A | 5/1988 | Ueki |
| 5,041,780 | A | 8/1991 | Rippel |
| 5,367,257 | A | 11/1994 | Garshelis |
| 5,757,180 | A | 5/1998 | Chou et al. |
| 5,781,005 | A | 7/1998 | Vig et al. |
| 5,898,301 | A | 4/1999 | La Croix et al. |
| 5,917,320 | A | 6/1999 | Scheller et al. |
| 6,091,239 | A | 7/2000 | Vig et al. |
| 6,278,269 | B1 | 8/2001 | Vig et al. |
| 6,448,760 | B1 | 9/2002 | Neumann |

(Continued)

FOREIGN PATENT DOCUMENTS

| | | | |
|---|---|---|---|
| CN | 112649645 | A | 4/2021 |
| EP | 2546611 | A1 | 1/2013 |
| WO | WO 2014/029885 | A1 | 2/2014 |

OTHER PUBLICATIONS

U.S. Appl. No. 18/512,122, filed Nov. 17, 2023, McNally, et al.

(Continued)

*Primary Examiner* — Lee E Rodak
*Assistant Examiner* — Zannatul Ferdous
(74) *Attorney, Agent, or Firm* — Daly, Crowley, Mofford & Durkee, LLP.

(57) ABSTRACT

A sensor, comprising: a conductor having a curved portion; a first anchor magnetic field sensing element that is formed at an intersection of a first axis and a second axis that is substantially perpendicular to the first axis, the first magnetic field sensing element being formed on a space that is partially enclosed by the curved portion; a first magnetic field sensing element that is formed on the first axis, the first magnetic field sensing element being disposed on an opposite side of the conductor from the first anchor magnetic field sensing element; and a second magnetic field sensing element that is formed on the second axis, the second magnetic field sensing element being disposed on an opposite side of the conductor from the first anchor magnetic field sensing element.

27 Claims, 8 Drawing Sheets

(56) References Cited

U.S. PATENT DOCUMENTS

| | | | | |
|---|---|---|---|---|
| 6,515,471 | B1 | 2/2003 | Santos | |
| 6,525,531 | B2 | 2/2003 | Forrest et al. | |
| 6,693,419 | B2 | 2/2004 | Stauth et al. | |
| 6,762,897 | B1 | 7/2004 | Kabashima et al. | |
| 6,969,988 | B2 | 11/2005 | Kakuta et al. | |
| 7,026,808 | B2 | 4/2006 | Vig et al. | |
| 7,253,614 | B2 | 8/2007 | Forrest et al. | |
| 7,368,904 | B2 | 5/2008 | Scheller et al. | |
| 7,469,604 | B2 | 12/2008 | Hedayat et al. | |
| 7,476,816 | B2 | 1/2009 | Doogue et al. | |
| 7,535,215 | B2 | 5/2009 | Forster | |
| 7,598,601 | B2 | 10/2009 | Taylor et al. | |
| 7,714,570 | B2 | 5/2010 | Thomas et al. | |
| 7,777,607 | B2 | 8/2010 | Taylor et al. | |
| 7,816,905 | B2 | 10/2010 | Doogue et al. | |
| 7,911,203 | B2 | 3/2011 | Thomas et al. | |
| 7,936,164 | B2 | 5/2011 | Doogue et al. | |
| 7,994,774 | B2 | 8/2011 | Thomas et al. | |
| 8,125,216 | B2 | 2/2012 | Thomas et al. | |
| 8,169,214 | B2 | 5/2012 | Zak | |
| 8,450,996 | B2 | 5/2013 | Foletto et al. | |
| 8,593,136 | B2 | 11/2013 | Franke et al. | |
| 8,624,588 | B2 | 1/2014 | Vig et al. | |
| 8,659,289 | B2 | 2/2014 | Saruki | |
| 8,729,892 | B2 | 5/2014 | Friedrich | |
| 8,749,227 | B2 | 6/2014 | Thomas et al. | |
| 8,847,590 | B2 | 9/2014 | Flock et al. | |
| 8,896,295 | B2 | 11/2014 | Friedrich et al. | |
| 8,907,437 | B2 | 12/2014 | Milano et al. | |
| 8,907,669 | B2 | 12/2014 | Petrie | |
| 9,081,041 | B2 | 7/2015 | Friedrich et al. | |
| 9,176,170 | B2 | 11/2015 | Racz | |
| 9,190,606 | B2 | 11/2015 | Liu et al. | |
| 9,470,506 | B2 | 10/2016 | Schaffer | |
| 9,557,191 | B2 | 1/2017 | Hirota | |
| 9,625,535 | B2 | 4/2017 | Cadugan et al. | |
| 9,664,752 | B2 | 5/2017 | Monreal et al. | |
| 9,733,106 | B2 | 8/2017 | Judkins, III et al. | |
| 9,797,746 | B2 | 10/2017 | Vuillermet et al. | |
| 9,812,637 | B2 | 11/2017 | Fermon et al. | |
| 9,852,832 | B2 | 12/2017 | Sirohiwala et al. | |
| 9,859,489 | B2 * | 1/2018 | Doogue | B82Y 25/00 |
| 9,897,464 | B2 | 2/2018 | Judkins, III et al. | |
| 10,048,718 | B2 | 8/2018 | Sirohiwala et al. | |
| 10,066,964 | B2 | 9/2018 | Sirohiwala et al. | |
| 10,132,649 | B2 | 11/2018 | Janisch | |
| 10,215,550 | B2 | 2/2019 | Metivier | |
| 10,481,181 | B2 | 11/2019 | Bussing et al. | |
| 10,502,589 | B2 | 12/2019 | Granig | |
| 10,866,117 | B2 | 12/2020 | Kozomora et al. | |
| 10,866,287 | B1 | 12/2020 | Lassalle-Balier et al. | |
| 11,162,815 | B2 | 11/2021 | Sirohiwala et al. | |
| 11,226,382 | B2 | 1/2022 | Augendre et al. | |
| 11,366,141 | B1 | 6/2022 | Daubert et al. | |
| 11,519,946 | B1 | 12/2022 | Rock et al. | |
| 11,561,112 | B2 | 1/2023 | Briano et al. | |
| 11,656,250 | B2 | 5/2023 | Vuillermet et al. | |
| 11,768,229 | B2 | 9/2023 | Boden et al. | |
| 12,112,865 | B2 | 10/2024 | Messier et al. | |
| 12,130,342 | B2 | 10/2024 | Lassalle-Balier et al. | |
| 12,163,983 | B2 | 12/2024 | Liu et al. | |
| 2009/0174395 | A1 | 7/2009 | Thomas et al. | |
| 2009/0295375 | A1 | 12/2009 | Oohira | |
| 2011/0187351 | A1 | 8/2011 | Hunger | |
| 2011/0246133 | A1 | 10/2011 | Harada et al. | |
| 2012/0038359 | A1 | 2/2012 | Saruki et al. | |
| 2012/0176070 | A1 | 7/2012 | Wallrafen | |
| 2012/0217955 | A1 | 8/2012 | Petrie | |
| 2012/0249126 | A1 | 10/2012 | Friedrich et al. | |
| 2012/0249133 | A1 * | 10/2012 | Friedrich | G01R 33/091 324/247 |
| 2014/0176126 | A1 | 6/2014 | Friedrich et al. | |
| 2015/0022197 | A1 | 1/2015 | David et al. | |
| 2015/0142376 | A1 | 5/2015 | Ausserlechner | |
| 2015/0194597 | A1 | 7/2015 | Fermon et al. | |
| 2015/0362335 | A1 | 12/2015 | Spitzer et al. | |
| 2015/0377648 | A1 | 12/2015 | Sirohiwala | |
| 2016/0123771 | A1 | 5/2016 | David et al. | |
| 2016/0161289 | A1 | 6/2016 | Fujita | |
| 2016/0178400 | A1 | 6/2016 | Vuillermet et al. | |
| 2017/0016745 | A1 | 1/2017 | Onaka | |
| 2017/0123016 | A1 | 5/2017 | Deak | |
| 2017/0219664 | A1 | 8/2017 | Alpago et al. | |
| 2017/0248445 | A1 | 8/2017 | Ausserlechner | |
| 2017/0328701 | A1 | 11/2017 | Ausserlechner | |
| 2017/0336481 | A1 | 11/2017 | Latham et al. | |
| 2018/0172481 | A1 | 6/2018 | Mochizuki | |
| 2018/0180649 | A1 | 6/2018 | Paci et al. | |
| 2018/0231425 | A1 | 8/2018 | Ponce et al. | |
| 2018/0238938 | A1 | 8/2018 | Feucht et al. | |
| 2018/0238973 | A1 * | 8/2018 | Yuan | G01R 33/096 |
| 2019/0120659 | A1 * | 4/2019 | Bussan | G01D 5/145 |
| 2019/0158007 | A1 | 5/2019 | Mori | |
| 2019/0162559 | A1 | 5/2019 | Ohta et al. | |
| 2019/0234763 | A1 * | 8/2019 | Foletto | G01R 33/025 |
| 2019/0234764 | A1 | 8/2019 | Lassalle-Balier | |
| 2019/0265071 | A1 | 8/2019 | Ruigrok | |
| 2019/0383646 | A1 | 12/2019 | Lassalle-Balier | |
| 2019/0383885 | A1 | 12/2019 | Sitorus et al. | |
| 2019/0391185 | A1 | 12/2019 | El Bacha et al. | |
| 2020/0057097 | A1 | 2/2020 | Vuillermet et al. | |
| 2020/0057120 | A1 | 2/2020 | Belin et al. | |
| 2021/0285794 | A1 * | 9/2021 | Briano | G01R 33/075 |
| 2023/0221355 | A1 | 7/2023 | Liu | |
| 2023/0251290 | A1 | 8/2023 | Vuillermet et al. | |
| 2024/0047314 | A1 | 2/2024 | Briano et al. | |
| 2024/0412891 | A1 | 12/2024 | Messier et al. | |
| 2025/0012876 | A1 | 1/2025 | Lassalle-Balier et al. | |

OTHER PUBLICATIONS

U.S. Appl. No. 18/808,279, filed Aug. 19, 2024, Hein, et al.

U.S. Appl. No. 18/882,963, filed Sep. 12, 2024, Taylor.

U.S. Appl. No. 19/061,094, filed Feb. 24, 2025, Pavlovic, et al.

Allegro MicroSystems, LLC, "Coreless, High Precision, Hall-Effect Current Sensor IC with Common-Mode Field Rejection and High Bandwidth (240 kHz);" ACS37612 Data Sheet; Mar. 9, 2020; 22 Pages.

Extended European Search Report and Written Opinion dated Jan. 23, 2020 for EP Application No. 19192640.1-1010; 7 Pages.

Response (with Amended Claims) to European Official Communication dated Mar. 23, 2020 and to the Extended European Search Report and Written Opinion dated Jan. 23, 2020 for European Application No. 19192640.1; Response filed Sep. 17, 2020; 13 Pages.

European Examination Report dated Jun. 29, 2021 for European Application No. 19192640.01, 5 Pages.

Office Action dated Apr. 3, 2020 for U.S. Appl. No. 16/131,656; 16 pages.

Response to Office Action dated Apr. 3, 2020, filed on Jul. 2, 2020 for U.S. Appl. No. 16/131,656; 15 pages.

Office Action dated Oct. 7, 2020 for U.S. Appl. No. 16/131,656; 15 pages.

Response to Office Action dated Oct. 7, 2020, filed on Nov. 18, 2020 for U.S. Appl. No. 16/131,656; 8 pages.

Office Action dated Feb. 22, 2021 for U.S. Appl. No. 16/131,656; 22 pages.

Response to Office Action dated Feb. 22, 2021, filed on May 20, 2021 for U.S. Appl. No. 16/131,656; 18 pages.

Final Office Action dated Jul. 15, 2021 for U.S. Appl. No. 16/131,656; 10 pages.

Response to Final Office Action dated Jul. 15, 2021, filed on Aug. 12, 2021 for U.S. Appl. No. 16/131,656; 9 pages.

Advisory Action dated Aug. 24, 2021 for U.S. Appl. No. 16/131,656; 2 pages.

Response to Final Office Action dated Jul. 15, 2021, filed on Aug. 25, 2021 for U.S. Appl. No. 16/131,656; 9 pages.

Notice of Allowance dated Sep. 15, 2021 for U.S. Appl. No. 16/131,656; 5 pages.

(56) References Cited

OTHER PUBLICATIONS

Office Action dated May 20, 2022 for U.S. Appl. No. 16/818,199, 10 pages.

Response to Office Action dated May 20, 2022 filed on Aug. 12, 2022 for U.S. Appl. No. 16/818,199, 12 pages.

Notice of Allowance dated Nov. 25, 2022 for U.S. Appl. No. 16/818,199, 10 pages.

* cited by examiner

DIFFERENTIAL SENSING ELEMENT PLACEMENT IN CURRENT SENSORS FOR HETEROGENEOUS STRAY FIELD IMMUNITY

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a sensor is provided, comprising: a conductor having a curved portion; a first anchor magnetic field sensing element that is formed at an intersection of a first axis and a second axis that is substantially perpendicular to the first axis, the first magnetic field sensing element being formed on a space that is partially enclosed by the curved portion; a first magnetic field sensing element that is formed on the first axis, the first magnetic field sensing element being disposed on an opposite side of the conductor from the first anchor magnetic field sensing element; and a second magnetic field sensing element that is formed on the second axis, the second magnetic field sensing element being disposed on an opposite side of the conductor from the first anchor magnetic field sensing element, wherein the anchor magnetic field sensing element, the first magnetic field sensing element, and the second magnetic field sensing element are so positioned as to measure a level of electrical current through the conductor.

According to aspects of the disclosure, a sensor is provided, comprising: one or more first terminals; one or more second terminals; a conductor having a curved portion; a first anchor magnetic field sensing element that is formed at an intersection of a first axis and a second axis that is substantially perpendicular to the first axis, the first anchor magnetic field sensing element being disposed above or below a space that is partially enclosed by the curved portion; a first magnetic field sensing element that is formed on the first axis, the first magnetic field sensing element being disposed on an opposite side of the conductor from the first anchor magnetic field sensing element; a second magnetic field sensing element that is formed on the second axis, the second magnetic field sensing element being disposed on an opposite side of the conductor from the first anchor magnetic field sensing element; a first processing circuit configured to generate a first differential signal, the first differential signal being based on respective outputs of the first anchor magnetic field sensing element and the first magnetic field sensing element, the first differential signal being output on the one or more first terminals; and a second processing circuit configured to generate a second differential signal, the second differential signal being based on respective outputs of the first anchor magnetic field sensing element and the second magnetic field sensing element, the second differential signal being output on the one or more second terminals, wherein the anchor magnetic field sensing element, the first magnetic field sensing element, and the second magnetic field sensing element are so positioned as to measure a level of electrical current through the conductor.

According to aspects of the disclosure, a sensor is provided, comprising: a first substrate; a second substrate that is disposed above or below the first substrate; a conductor having a curved portion; a first anchor magnetic field sensing element that is formed on the first substrate, the first anchor magnetic field sensing element being formed at an intersection of a first axis and a second axis that is substantially perpendicular to the first axis, the first anchor magnetic field sensing element being disposed above or below a space that is partially enclosed by the curved portion; a second anchor magnetic field sensing element that is formed on the first substrate, the second anchor magnetic field sensing element being formed at the intersection of the first axis and the second axis, the second anchor magnetic field sensing element being disposed above or below the space that is partially enclosed by the curved portion; a first magnetic field sensing element that is formed on the first substrate, the first magnetic field sensing element being formed on the first axis, the first magnetic field sensing element being disposed on an opposite side of the conductor from the first anchor magnetic field sensing element; a second magnetic field sensing element that is formed on the second substrate, the second magnetic field sensing element being formed on the second axis, the second magnetic field sensing element being disposed on an opposite side of the conductor from the second anchor magnetic field sensing element; and a semiconductor package that is configured to encapsulate, at least in part, the first substrate, the second substrate, the first anchor magnetic field sensing element, the second anchor magnetic field sensing element, the first magnetic field sensing element, the second magnetic field sensing element, and the conductor, wherein the first anchor magnetic field sensing element, the second anchor magnetic field sensing element, the first magnetic field sensing element, and the second magnetic field sensing element are so positioned as to measure a level of electrical current through the conductor.

According to aspects of the disclosure, a sensor is provided, comprising: a first anchor magnetic field sensing element that is formed at an intersection of a first axis and a second axis that is arranged at a first angle relative to the first axis, the first magnetic field sensing element being formed above or below a space that is partially enclosed by a curved portion of a conductor; a first magnetic field sensing element that is formed on the first axis, the first magnetic field sensing element being disposed on an opposite side of the conductor from the first anchor magnetic field sensing element; a second magnetic field sensing element that is formed on the second axis, the second magnetic field sensing element being disposed on an opposite side of the conductor from the first anchor magnetic field sensing element; and a semiconductor package that is configured to encapsulate the first anchor magnetic field sensing element, the first magnetic field sensing element, and the second magnetic field sensing element, wherein the anchor magnetic field sensing element, the first magnetic field sensing element, and the second magnetic field sensing element are configured to measure a level of electrical current through the conductor.

BRIEF DESCRIPTION OF THE DRAWINGS

The foregoing features may be more fully understood from the following description of the drawings in which.

DETAILED DESCRIPTION

Figure 1A:
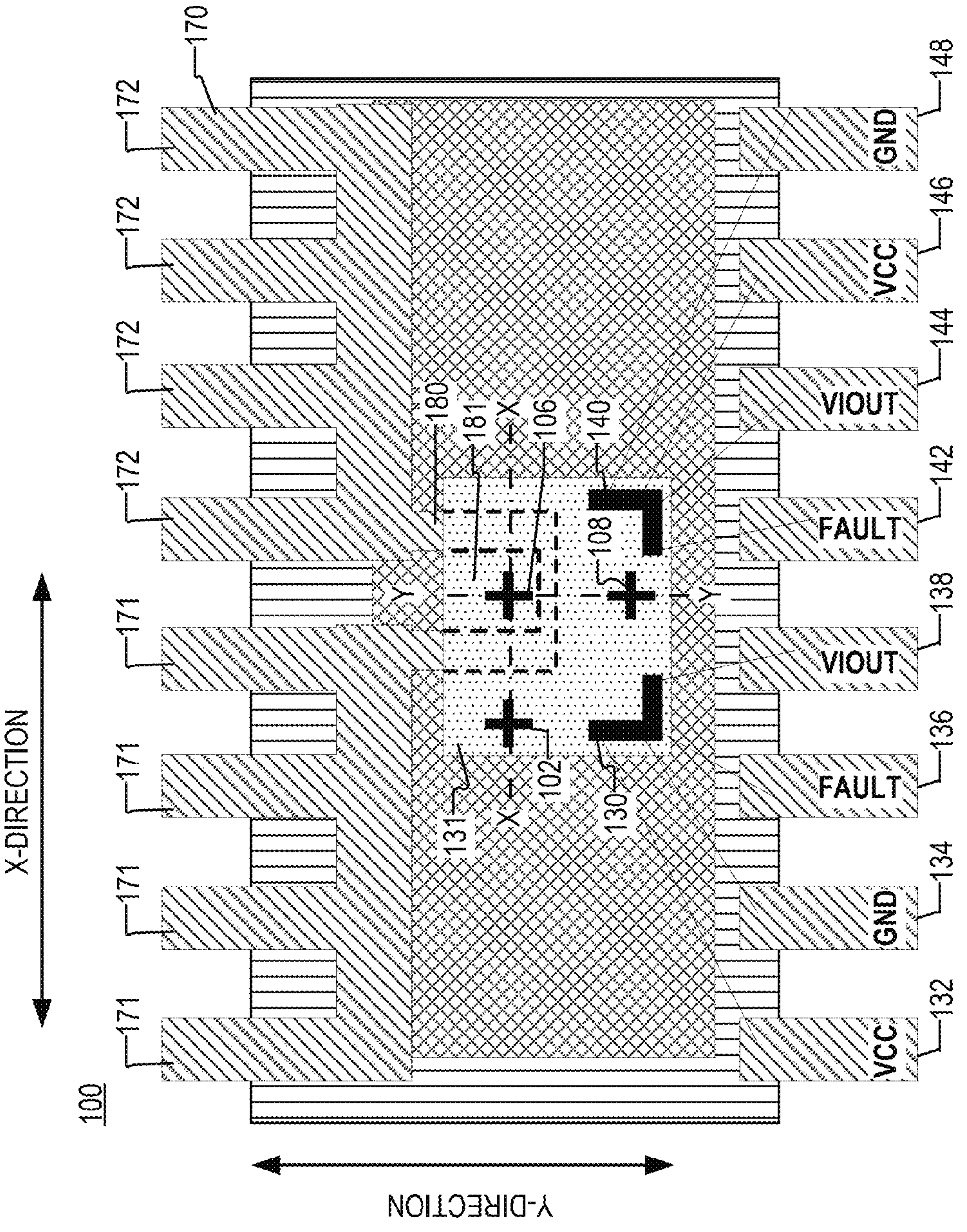
FIG. 1A is a schematic top-down view of a single-die current sensor, according to aspects of the disclosure.

FIG. 1A is a schematic top-down view of an example of a single-die current sensor 100, according to aspects of the disclosure. Sensor 100 includes two pairs of sensing elements that are oriented in different directions. The two pairs may have one sensing element in common (e.g., sensing element 106). Sensor 100 is configured to output a first differential signal and a second differential signal. The first differential signal is generated based on the outputs of the sensing elements in the first pair. The second differential signal is generated based on the outputs of the sensing elements in the second pair. Because the two pairs have different orientations, the first and second signals are immune to stray magnetic fields coming from different directions—i.e., the first differential signal is immune from stray magnetic fields coming from one direction and the second differential signal is not affected by magnetic fields coming from a different direction. The first and second differential signals can be output on different terminals of sensor 100. The first and second differential signals complement each other, in terms of resistance to stray magnetic fields, and they may be used by external circuitry to achieve increased fault tolerance.

Sensor 100 may include a sensor die 131, a leadframe 170, and a plurality of terminals 132-148. The sensor die 131 may include a silicon substrate, a gallium nitride (GaN) substrate, a sapphire substrate, and/or any other suitable type of substrate. Formed on the sensor die 131 may be an anchor magnetic field sensing element 106 (hereinafter "anchor sensing element 106"), a magnetic field sensing element 102 (hereinafter "first sensing element 102"), a magnetic field sensing element 108 (hereinafter "second sensing element 108"), a processing circuit 130, and a processing circuit 140.

The anchor sensing element 106 may be formed at the intersection of axes X-X and Y-Y, the first sensing element 102 may be formed on axis X-X, and the second sensing element 108 may be formed on axis Y-Y. The X-X and Y-Ya xes rest in the plane of the leadframe 170, which is parallel (or substantially parallel) to the plane of the sensor die 131. As used throughout the disclosure, the phrase "sensing element is formed on an axis" shall mean that the sensing element is disposed directly on the axis", "disposed directly above the axis", or disposed "directly below the axis". As used throughout the disclosure, the phrase "sensing element is formed at an intersection of a first axis and a second axis" shall mean that the sensing element is disposed directly on the intersection", "disposed directly above the intersection", or disposed "directly below the intersection". According to the present example, axes X-X and Y-Y are substantially perpendicular. However, in alternative implementations, axes X-X and Y-Y may be arranged at an angle that is different than 90 degrees (e.g., 10°, 20°, 30°, 40°, 50°, 60°, 70°, 80°, 100°, 110°, 120°, 130°, 140°, 150°, etc.). Stated succinctly, the present disclosure is not limited to any specific relative orientation of axes X-X and Y-Y.

According to the present example, sensing elements 102, 106, and 108 are planar Hall elements. However, the present disclosure is not limited to any specific type of magnetic field sensing elements being used in sensor 100. For example, in some implementations, any of sensing elements 102, 106, and 108 may include a giant magnetoresistance (GMR) element, a vertical Hall element, a spin valve, an anisotropic magnetoresistance element (AMR), a tunneling magnetoresistance (TMR) element, and a magnetic tunnel junction (MTJ) element, and/or any other suitable type of sensing element.

Sensing elements 102, 106, and 108 are configured to measure the level of electrical current that is flowing through the leadframe 170. Leadframe 170 may be formed of metal and/or any other suitable type of conductive material. As illustrated in FIG. 1D, leadframe 170 may include a plurality of terminals 171 that are coupled to a plurality of terminals 172 via a curved portion 180. In operation, electrical current may flow from terminals 171 to terminals 172, and the sensing elements 102, 106, and 108 may measure the level of the electrical current as it passes through curved portion 180. The curved portion may have one of a C-shape, a U-shape, and/or another suitable type of curve. As illustrated in FIG. 1D, curved portion 180 may partially enclose an interior space 181. The interior space is denoted in FIG. 1D with a cross-hatch pattern.

The interior space is situated directly below the intersection of axes X-X and Y-Y. As a result, the anchor sensing element 106 is situated directly above the interior space 181, while sensing elements are situated above and to the side of interior space 181. In the present example, portion 180 forms a loop so that current entering the package can exit the package on the same side. As noted above, portion 180 forms a loop around the anchor element 106 and two differential pairs are formed in the X and Y dimensions with elements 102 and 108 respectively. Although, in the present example, portion 180 defines a loop (or a C-shape), in alternative implementations portion 180 may have an L-shape. Such an arrangement would still allow the placement of two differential pairs, while also allowing electrical current to enter and exit on different sides of the package (for example on two adjacent sides)

Processing circuit 130 may be arranged to generate a first differential signal based on the outputs of the anchor sensing element 106 and the first sensing element 102. The first differential signal may be indicative of the level of electrical current through leadframe 170.

Processing circuit 130 may include any suitable type of digital or analog circuitry that is normally found in current sensors. By way of example, the processing circuit 130 may include one or more of: one or more amplifiers, one or more digital-to-analog converters (DACs), one or more analog-to-digital converters (ADCs), one or more voltage regulators, a special-purpose processor, a general-purpose processor, a CORDIC processor, and/or any other suitable type of electronic circuitry. An example of one possible implementation of processing circuit 130 is discussed further below with respect to FIG. 5.

Processing circuit 140 may be arranged to generate a second differential signal based on the outputs of the anchor sensing element 106 and the second sensing element 108. The second differential signal may be indicative of the level of electrical current through leadframe 170. Processing circuit 140, in the present example, has a configuration that is identical to that of processing circuit 130. However, the present disclosure is not limited to any specific configuration for processing circuit 140.

Processing circuit 130 is coupled (via bonding wires) to a voltage source (VCC) terminal 132, a ground terminal 134, a fault terminal 136, and an output terminal 138. Processing circuit 140 is coupled (via bonding wires) to a voltage source (VCC) terminal 146, a ground terminal 148, a fault terminal 142, and an output terminal 144. According to the present example, processing circuit 130 is arranged to output the first differential signal on terminal 138, and processing circuit 140 is configured to output the second differential signal on terminal 144.

As noted above, the processing circuit 130 may generate a first differential signal that is at least in part based on the difference between the outputs of anchor sensing element 106 and the first sensing element 102. As can readily appreciated, the first differential signal may be indicative of the level of electrical current trough leadframe 170, and through curved portion 180 in particular. The first differential signal may be immune from stray magnetic fields that are produced by external electrical currents flowing in the X-direction (shown in FIG. 1A). For instance, when sensor 100 is mounted inside an electrical vehicle, the external electrical currents may be electrical currents that are not intended to be measured by sensor 100, but which nevertheless interfere with the measurements taken by sensor 100 (possibly as a result of the wires that carry these electrical currents being situated too close to sensor 100).

As noted above, the processing circuit 140 may generate a second differential signal that is at least in part based on the difference between the outputs of anchor sensing element 106 and the second sensing element 108. As can readily appreciated, the second differential signal may be indicative of the level of electrical current trough leadframe 170, and through curved portion 180 in particular. The second differential signal may be immune from stray magnetic fields that are produced by external electrical currents flowing in the Y-direction (shown in FIG. 1A). For instance, when sensor 100 is mounted inside an electrical vehicle, the external electrical currents may be electrical currents that are not intended to be measured by sensor 100, but which nevertheless interfere with the measurements taken by sensor 100 (possibly as a result of the wires that carry these electrical currents being situated too close to sensor 100).

As noted above, the first differential signal may be output on terminal 138 and the second output signal may be output on terminal 144. In some implementations, terminals 138 and 144 may be coupled to external circuitry (e.g., an external processor). The external circuitry may be configured to determine the level of electrical current through leadframe 170 based on the first and second differential signals. For example, the external circuitry may calculate the average of the first and second signals, and use the average to determine determine the level of electrical current through leadframe 170.

Although, in the present example, processing circuit 130 and 140 are depicted as separate entities, alternative implementations are possible in which processing circuit 130 is at least partially integrated with processing circuit 140. Furthermore, in some implementations, one of processing circuits 130 and 140 may be omitted.

Although, in the example of FIGS. 1A-D, processing circuits 130 and 140 are configured to output the first and second differential signals, alternative implementations are possible in which one of processing circuits 130 and 140 is configured to generate an output signal and place the generated output signals on one of terminals 138 and 144. The output signal may be generated by taking the average of the first and second differential signals. Additionally or alternatively, the output signal may be generated by performing additional processing on the average signal. The additional processing may include any processing that is performed in conventional current sensors on a regular differential signal (i.e., a differential signal that is generated by a pair of magnetic field sensing elements, rather than the average of two different differential signals). Those of ordinary skill in the art will readily recognize that there are various ways for a current sensor to use a differential signal obtained from a pair of Hall elements to generate an output signal that is indicative of the level of electrical current through a conductor. In this regard, the present disclosure is not limited to any specific method for processing the average signal.

For ease of description, processing circuits 130 and 140 are each provided with a separate set of terminals. In the example of FIG. 1A, processing circuit 130 is coupled to terminals 132-138, and processing circuit 140 is coupled to terminals 142-148. However, it will be understood that in most practical applications, processing circuits 130 and 140 may use the same terminal to receive power (e.g., terminal 132), the same terminal to obtain ground (e.g., terminal 134), and the same terminal to report faults (e.g., terminal 136).

The present disclosure is not limited to any specific positioning of sensing elements 102, 106, and 108 relative to the leadframe 170. According to the present example, all of the sensing elements 102, 106, and 108 are situated above leadframe 170. However, alternative implementations are possible in which one or more of sensing elements 102, 106, and 108 are situated below the curved portion 180. In such implementations, the anchor sensing element 106 may be situated directly below the interior space 181 that is partially enclosed by curved portion 180 of leadframe 170. For example, in some implementations, the entire sensor die 131 may be situated below curved portion 180. As another example, one or more of sensing elements 102, 106, and 108 may be situated on a first die that is above leadframe 170 and the rest of sensing elements 102, 106, and 108 may be disposed on a second die that is below leadframe 170.

Figure 1B:
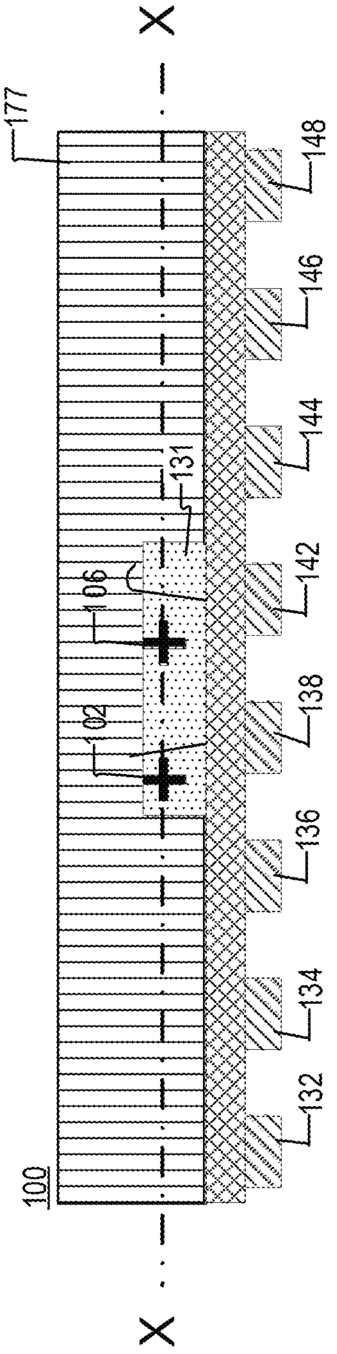
FIG. 1B is a schematic side view of the single-die current sensor of FIG. 1A, according to aspects of the disclosure.
Figure 1C:
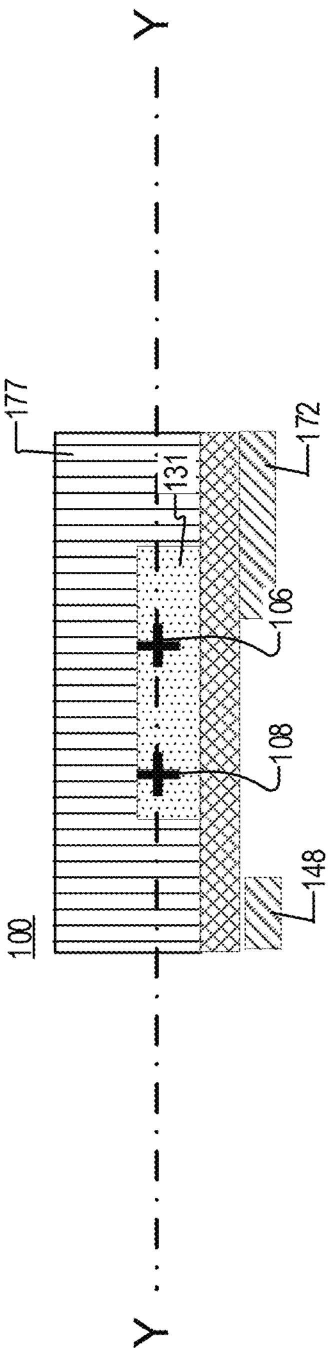
FIG. 1C is a schematic side view of the single-die current sensor of FIG. 1A, according to aspects of the disclosure.
Figure 1D:
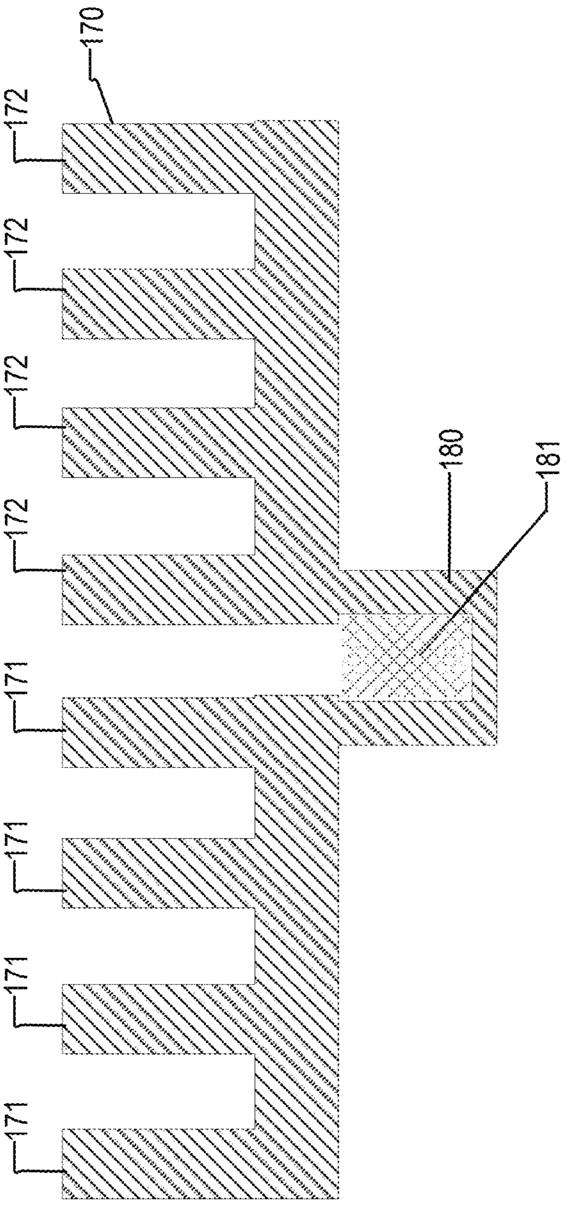
FIG. 1D is a diagram of an example of a leadframe, according to aspects of the disclosure.

FIGS. 1B-C are cross-sectional side views of sensor 100. FIGS. 1B-C illustrate that the sensor die 131, together with the anchor sensing element 106, the first sensing element 102, the second sensing element 108, and processing circuit 130 may be encapsulated in dielectric material 177 to complete the semiconductor packaging of sensor 100. Dielectric material 177 may include any suitable type of material that is commonly used in semiconductor packaging, such as an epoxy resin material or a polyamide material.

Figure 2A:
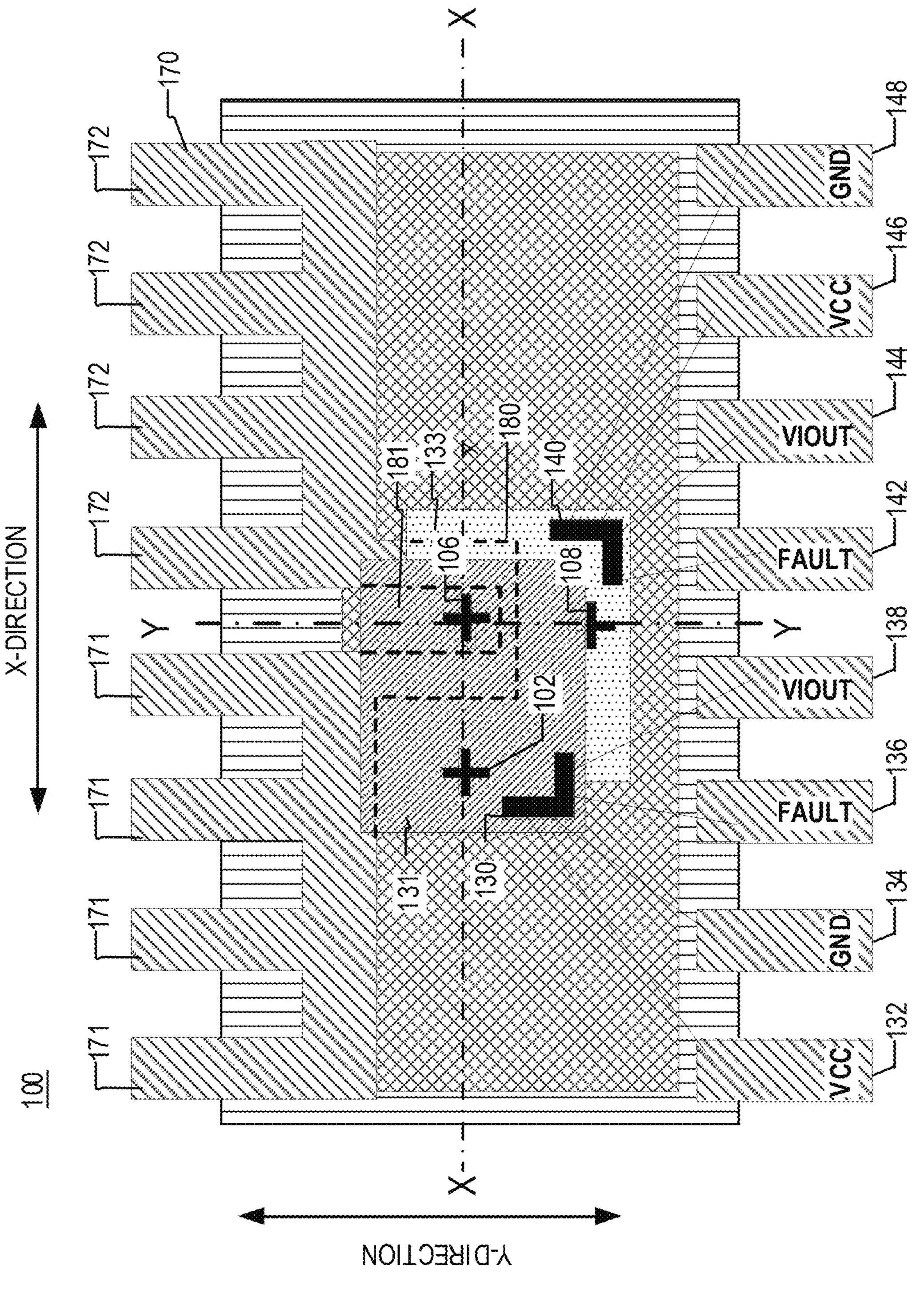
FIG. 2A is a schematic top-down view of a stacked-die current sensor, according to aspects of the disclosure.
Figure 2B:
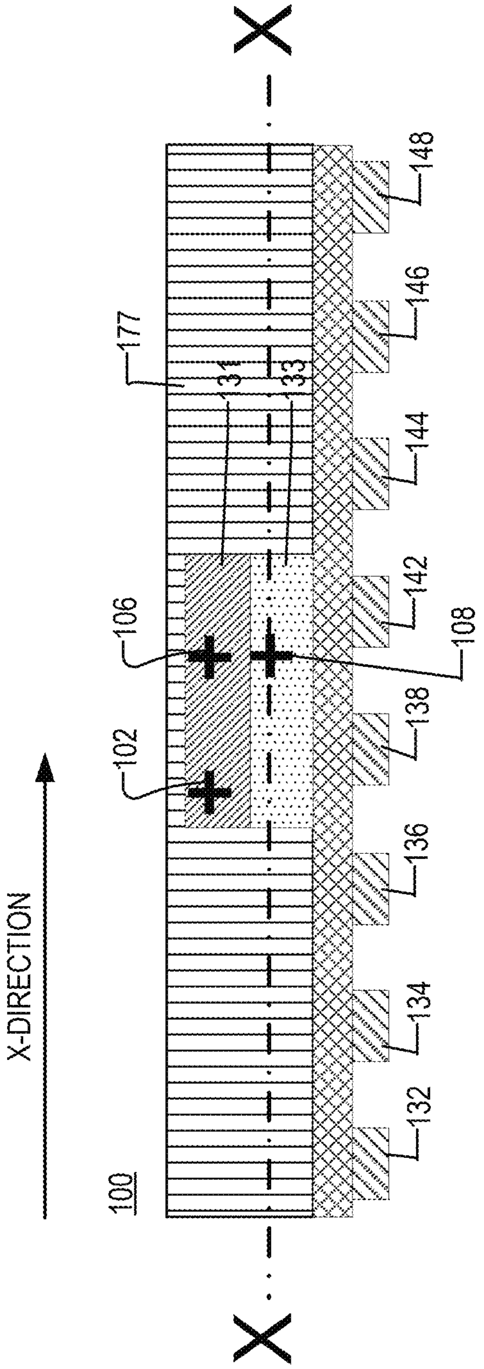
FIG. 2B is a schematic side view of the stacked-die current sensor of FIG. 2A, according to aspects of the disclosure.
Figure 2C:
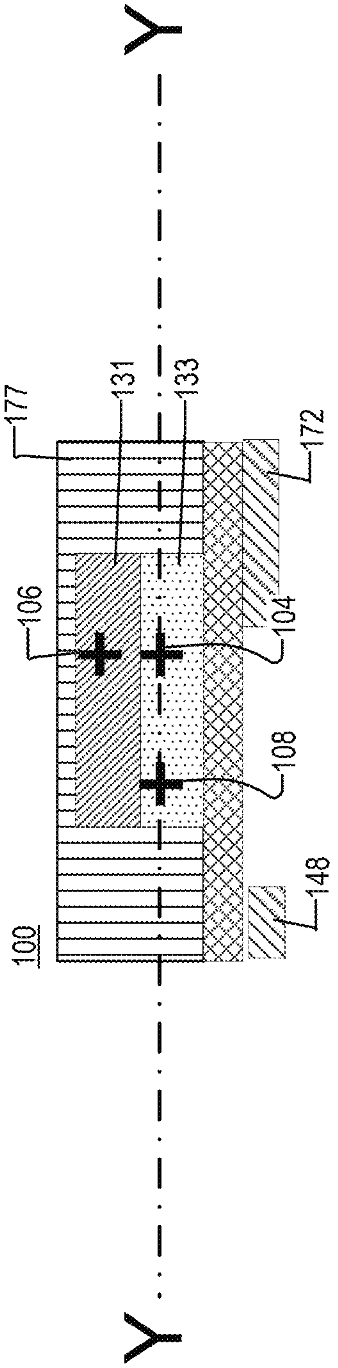
FIG. 2C is a schematic side view of the stacked current sensor of FIG. 2A, according to aspects of the disclosure.

FIGS. 2A-C shows an example of sensor 100, according to another implementation. The implementation of sensor 100 which is shown in FIGS. 2A-C is nearly identical to the implementation of sensor 100 that is shown in FIGS. 1A-D, but for the following differences. The implementation shown in FIGS. 1A-C features two sensing element pairs that share the same anchor sensing element (i.e., sensing element 106), whereas, in the implementation of FIGS. 2A-C, each of the two pairs has a different anchor sensing element, and the two pairs are formed on different sensor dies.

More particularly, in the example of FIGS. 2A-C, sensor 100 includes a sensor die 133 in addition to the sensor die 131. Sensor die 133 may be the same or similar to sensor die 131. The sensor die 133 may include a silicon substrate, a gallium nitride (GaN) substrate, a sapphire substrate, and/or any other suitable type of substrate. Sensor die 133 may be disposed below the sensor die 131. Sensor dies 131 and 133 may be packaged using any suitable type of die stacking technique, such as as Through-Silicon Via (TSV) or interposer-based stacking.

In the example of FIGS. 2A-C, the second sensing element 108 is omitted from sensor die 131. Rather, the second sensing element 108 is formed on the sensor die 133 instead. In the example of FIGS. 2A-C, the second sensing element 108 is again formed on the Y-Y axis. The processing circuit 140 is omitted from sensor die 131. Rather, the processing circuit 140 is formed on the sensor die 133 instead. In addition, another anchor magnetic field sensing element 104 (hereinafter "anchor sensing element 104") is formed on the sensor die 133. Just like the anchor sensing element 106, the anchor sensing element is also formed on the intersection of the X-X and Y-Y axes. The anchor sensing element 104 may be disposed directly below the anchor sensing element 106, as shown.

According to the present example, the anchor sensing element 104 is a planar Hall element. However, the present disclosure is not limited to any specific implementation of the anchor sensing element 104. For example, the anchor sensing element 104 may include a giant magnetoresistance (GMR) element, a vertical Hall element, a spin valve, an anisotropic magnetoresistance element (AMR), a tunneling magnetoresistance (TMR) element, and a magnetic tunnel junction (MTJ) element, and/or any other suitable type of sensing element.

Processing circuit 130 is configured to operate in the manner discussed above with respect to FIGS. 1A-D. Specifically, processing circuit 130 is configured to generate a first differential signal that is at least in part based on the difference between the outputs of the anchor sensing element 106 and the first sensing element 102. As discussed above, the first differential signal may be output on terminal 138, and it may be indicative of the level of electrical current through leadframe 170. The first differential signal may be immune from stray magnetic fields that are produced by external electrical currents flowing in the X-direction (shown in FIG. 2A).

Processing circuit 140 is configured to operate in the manner discussed above with respect to FIGS. 1A-D. Specifically, processing circuit 140 is configured to generate a second differential signal that is at least in part based on the outputs of the anchor sensing element 104 and the second sensing element 108. The second differential signal may be output on terminal 138, and it may be indicative of the level of electrical current through leadframe 170. The second differential signal may be immune from stray magnetic fields that are produced by external electrical currents flowing in the Y-direction (shown in FIG. 2A).

FIGS. 2B-C are cross-sectional side views of sensor 100. FIGS. 2B-C show that the sensor dies 131 and 133, together with the anchor sensing element 106, the anchor sensing element 104, the first sensing element 102, the second sensing element 108, processing circuit 130, and processing circuit 140 may be encapsulated in dielectric material 177 to complete the semiconductor packaging of sensor 100. As noted above, dielectric material 177 may include any suitable type of material that is commonly used in semiconductor packaging, such as an epoxy resin material or a polyamide material.

In some implementations, one of processing circuits 130 and 140 may be configured to generate an output signal by further processing the first differential signal. The output signal may be generated by taking the average of the first and second differential signals. Additionally or alternatively, the output signal may be generated by performing additional processing on the average signal, in the manner discussed above. The output signal may be output on one of terminals 138 and 144.

The present disclosure, is not limited to any specific relative positioning of the sensor dies 131 and 133. Alternative implementations are possible in which sensor die 133 is disposed above sensor die 131 and/or sensor dies 131 and 133 are disposed on opposite sides of leadframe 170. In any of such implementations, anchor sensing elements 104 and 106 may be disposed directly above or below the interior space 181 (shown in FIG. 1D).

Figure 3A:
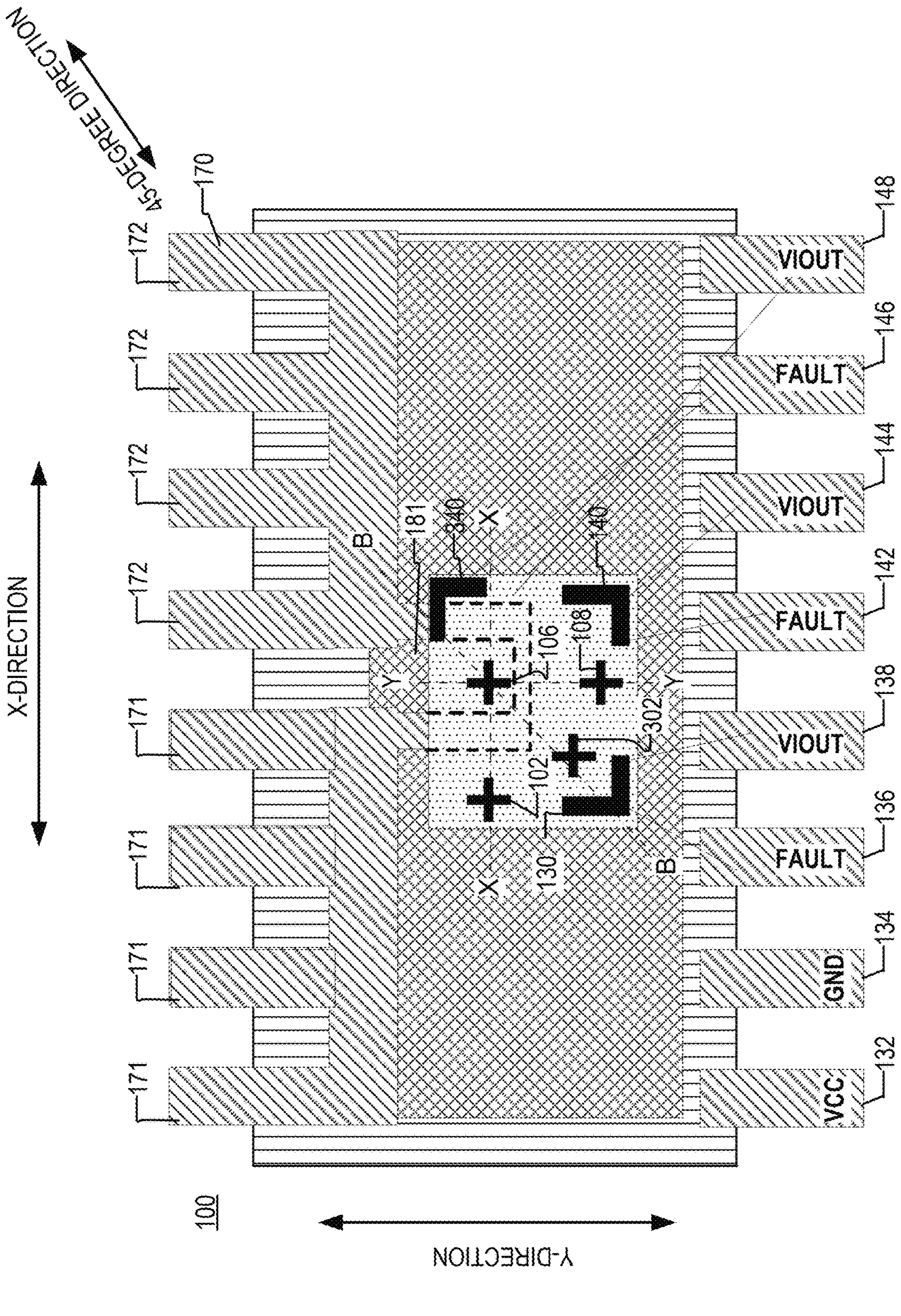
FIG. 3A is a schematic top-down view of a 4-element current sensor, according to aspects of the disclosure.
Figure 3B:
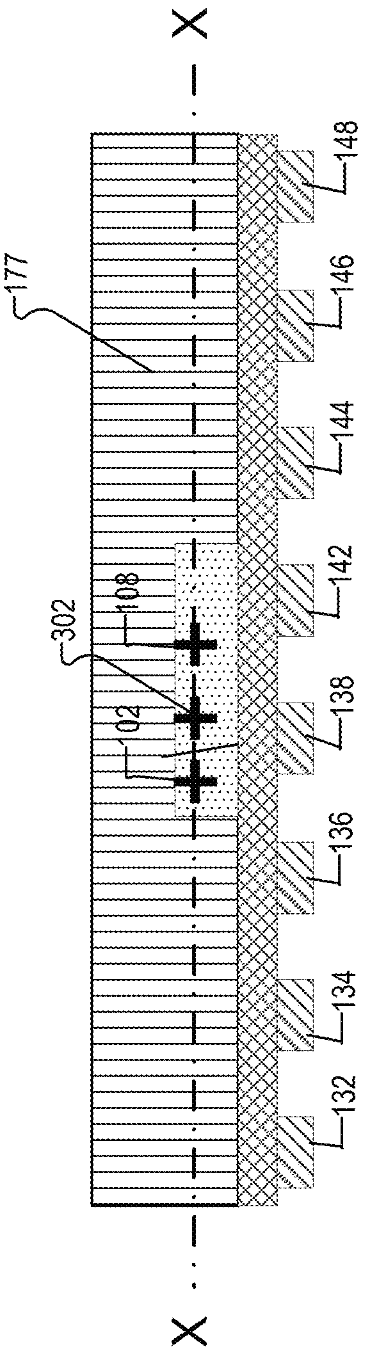
FIG. 3B is a schematic side view of the current sensor of FIG. 1A, according to aspects of the disclosure.

FIGS. 3A-B show an example of sensor 100, according to yet another implementation. The implementation of sensor 100 which is shown in FIGS. 3A-B is nearly identical to the implementation of sensor 100 that is shown in FIGS. 1A-D, but for the following differences.

In the example of FIGS. 3A-B, sensor 100 is provided an additional magnetic field sensing element (hereinafter "third sensing element 302"). The third sensing element 302 is formed on sensor die 131, in addition to the anchor element 106, the first sensing element 102, and the second sensing element 108. The third sensing element 302 is formed on an axis B-B. Axis B-B, axis X-X, and axis Y-Y intersect at the same point. Axis B-B is arranged at an angle of approximately 45 degrees relative to axis X-X. Axis B-B is also arranged at an angle of approximately 45 degrees relative to axis Y-Y. So, in the example of FIGS. 1A-D, sensor 100 is outfitted with two pairs of sensing elements—i.e., (106, 102) and 106, 108), whereas in the example of FIGS. 3A-B, sensor 100 is provided with three pairs of sensing elements—i.e., (106, 102), (106, 108), and (106, 302).

According to the present example, the third sensing element 302 is a planar Hall element. However, the present disclosure is not limited to any specific implementation of the third sensing element 302. For example, the third sensing element 302 may include a vertical Hall element, a giant magnetoresistance (GMR) element, for example, a spin valve, an anisotropic magnetoresistance element (AMR), a tunneling magnetoresistance (TMR) element, and a magnetic tunnel junction (MTJ) element, and/or any other suitable type of sensing element.

In another aspect, in the example of FIGS. 3A-B, sensor 100 is provided with a processing circuit 340, which has a configuration that is identical to the configuration of processing circuit 130. Processing circuit 340 may be configured to generate a third differential signal based on the difference between the outputs of the anchor sensing element 106 and the third sensing element 302. The third differential signal may be output on terminal 148. The third differential signal may be immune from stray magnetic fields that are produced by external electrical currents flowing in the 45-degree direction (shown in FIG. 3A).

In yet another aspect, in the example of FIGS. 3A-B, processing circuit 130, 140, and 340 share the same voltage supply and ground terminals (e.g., terminals 132 and 134). Furthermore, terminals 146 is re-purposed to output a fault signal that is generated by processing circuit 340, and terminal 148 is re-purposed to output the third differential signal.

As noted above, processing circuit 130 may be configured to generate a first differential signal based on the outputs of the anchor sensing element 106 and the first sensing element 102. Processing circuit 140 may be configured to generate a second differential signal based on the outputs of the anchor sensing element 106 and the second sensing element 108. And processing circuit 340 may be configured to generate a third differential signal based on the outputs of the anchor sensing element 106 and the third sensing element 302. The first differential signal may be output on terminal 138; the second differential signal may be output on terminal 144; and the third differential signal may be output on terminal 148. As noted above, the first differential signal may be immune from stray magnetic fields that are produced by external electrical currents flowing in the X-direction (shown in FIG. 3A). The second differential signal may be immune from stray magnetic fields that are produced by external electrical currents flowing in the Y-direction (shown in FIG. 3A). The third differential signal may be immune from stray magnetic fields that are produced by external electrical currents flowing in the 45-degree direction (shown in FIG. 3A).

The present disclosure is not limited to any specific configuration of processing circuit 340. As noted above, in some implementations, processing circuit 130, 140, and 340 may be, at least partially, integrated with each other. Furthermore, in some implementations, one of processing circuits 130 and 140 may be configured to generate an output signal by further processing the first differential signal. The output signal may be generated by taking the average of the first and second differential signals. Additionally or alternatively, the output signal may be generated by performing additional processing on the average signal, in the manner discussed above. The output signal may be output on one of terminals 138, 144, and 148.

FIG. 3B shows a cross-sectional side view of sensor 100. FIG. 3B shows that the sensor die 131, together with the anchor sensing element 106, the first sensing element 102, the second sensing element 108, the third sensing element 302, and processing circuit 130 may be encapsulated in dielectric material 177 to complete the semiconductor packaging of sensor 100. Dielectric material 177 may include any suitable type of material that is commonly used in semiconductor packaging, such as an epoxy resin material or a polyamide material.

The examples provided with respect to FIGS. 1A-3B are not mutually exclusive. Any of the features shown in these examples can be combined to produce further implementations of sensor 100. For example, in some implementations, a different anchor sensing element may be provided for each of the pairs of sensing elements that are shown in FIGS. 3A, and each of the pairs of sensing elements may be formed on a different sensor die.

As noted above, sensor 100 is configured to measure the level of electrical current through a conductor. The conductor in question is leadframe 170 (shown in FIG. 1A) and it is integrated into the packaging of sensor 100. However, alternative implementations are possible in which leadframe 170 is omitted from sensor 100. In such implementations, sensor 100 may be used to measure the level of electrical current through an external conductor. Furthermore, it will be understood that the present disclosure is not limited to any specific configuration of leadframe 170. For example, in one implementation, leadframe 170 may be a straight conductor. As another example, in some implementations, one or more of terminals 171 and 172 (shown in FIG. 1D) may be omitted.

As noted above, the phrase "sensing element is formed on an axis" shall mean that the sensing element is disposed directly on the axis", "disposed directly above the axis", or disposed "directly below the axis". In the example of FIGS. 1A-3B, axes B-B, X-X, and Y-Y rest in the plane of leadframe 170. The plane of leadframe is substantially parallel to the planes of sensor dies 131 and 133. Under the above definition, in any of the implementations shown in FIGS. 1A-3B, if one or more of sensing elements 102, 104, 106, 108, and 302 are projected onto the plane of leadframe 170, the projection of the first sensing element 102 will fall on axis X-X, the projection of the second sensing element 108 will fall on axis Y-Y, the projection of the third sensing element 302 will fall on axis B-B, the projection of anchor element 106 will fall on the intersection of axes X-X and Y-Y (and possibly B-B), and the projection of anchor sensing element 104 will fall on the intersection of axes X-X and Y-Y (and possibly B-B).

The phrase "sensing element A and B are disposed on opposite sides of conductor C" shall mean that when sensing elements A and B and the conductor C are projected in the same plane, the conductor C is situated between sensing elements A and B. In other words, sensing elements A and B are considered to be disposed on opposite sides of conductor C when sensing element A and sensing element B are both situated above conductor C, but sensing element A is to the left of conductor C and sensing element B is to the right of conductor C. Similarly, sensing elements A and B are considered to be disposed on opposite sides of conductor C when sensing element A and sensing element B are both situated below conductor C, but sensing element A is to the left of conductor C and sensing element B is to the right of conductor C. Moreover, sensing elements A and B are considered to be disposed on opposite sides of conductor C when one sensing element A is above and to the left of conductor C while sensing element B is below and to the right of conductor C.

In summary, the examples provided with respect to FIGS. 1A-3B illustrate aspects of a sensor design in which two or more pairs of sensing elements are provided. Each of the pairs can be characterized by an alignment line that passes through the sensors. The alignment lines of different pairs in the sensor design are arranged at an angle relative two each other, which causes the differential signals that are generated by different pairs to have immunity to stray magnetic fields.

In one example, the differential signals are output on different terminals of sensor 100. This arrangement is advantageous, because it gives circuit designers to different differential signals, that measure the same electrical current level, and which have respective immunities from stray fields that come from different circuit directions. Having access to such differential signals is advantageous because it provides the circuit designers with additional tools from achieving increased fault tolerance and extracting high-accuracy measurements from sensor 100.

In one example, the differential signals are combined internally in sensor 100 into a single output signal which measures the level of electrical current through leadframe 170 more accurately than any of the differential signals that are being combined. This arrangement is advantageous, because it increases the accuracy of sensor 100.

Figure 4:
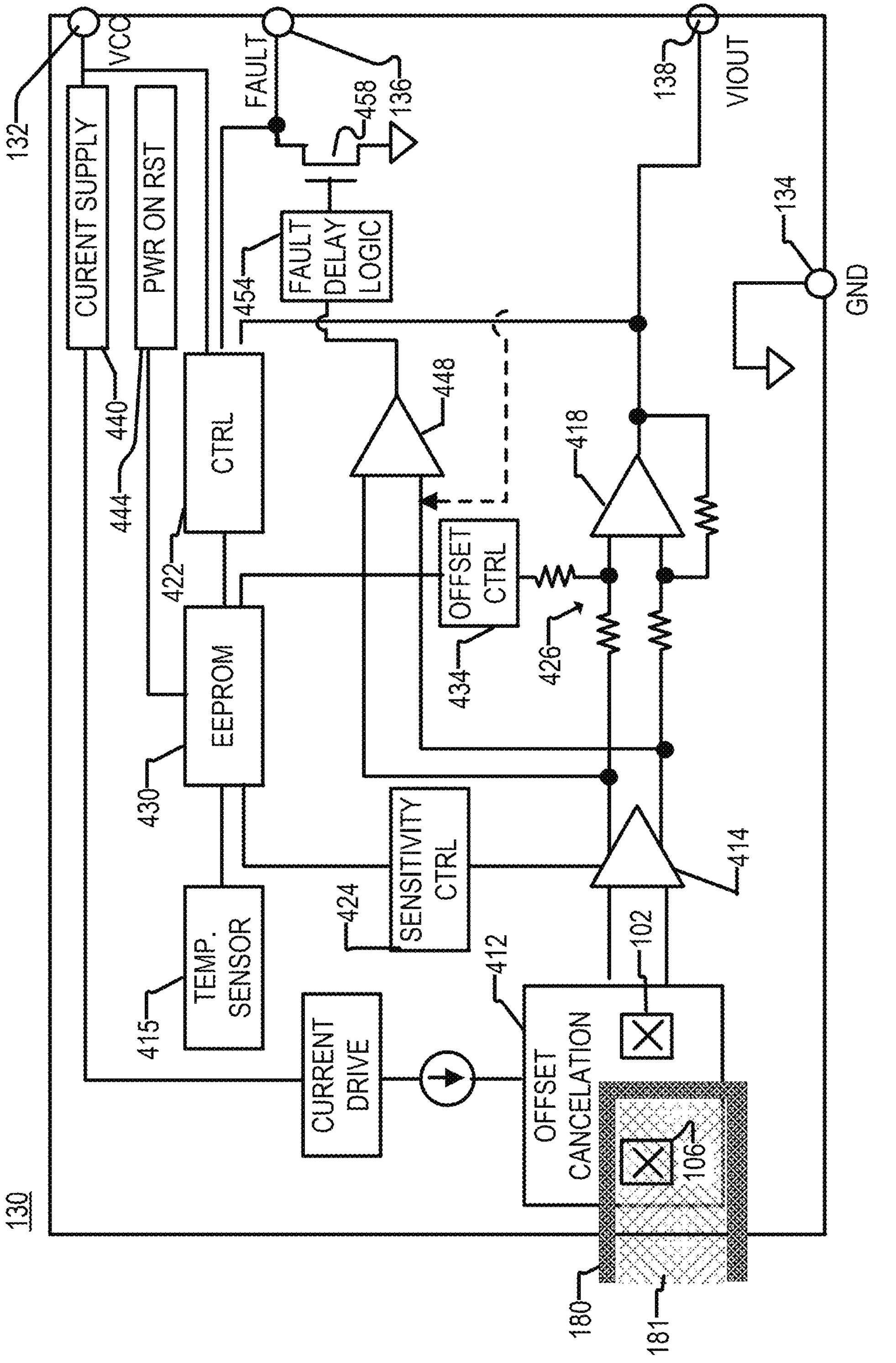
FIG. 4 is a diagram of an example of a processing circuit, according to aspects of the disclosure.

FIG. 4 is a diagram of the processing circuit 130, in accordance with one particular implementation. Also shown in FIG. 4 is curved portion 180 of the leadframe 170. As illustrated, curved portion 180 is arranged to define a curved shape that winds around the footprint of the anchor sensing element 106, while the footprint of the first sensing element 102 is situated outside of the interior space 181 that is enclosed by curved portion 180.

As illustrated, the processing circuit 130 may be coupled to four terminals in this example, including the VCC (supply voltage) terminal 132, the VIOUT (output signal) terminal 138, the GND (ground) terminal 134, and the fault terminal 136. The VCC terminal 132 is used for the input powered supply or supply voltage for processing circuit 130. The VCC terminal 132 can also be used for programming the processing circuit 130. A regulator 440 can be coupled to the VCC terminal 132 and to the various components and sub-circuits of the processing circuit 130 to regulate the supply current. A power on reset circuit 444 can provide a regulated voltage to EEPROM and control logic circuit 430 upon power up.

The VIOUT terminal 138 is used for providing the output signal to external circuitry. The output signal may be a differential signal that is based on the difference between the outputs of the anchor sensing element 106 and the first sensing element 102. Although terminal 138 is a voltage output, it is possible to have a current output. The VIOUT terminal 138 can also be used for programming, such as programming the zero ampere output.

The processing circuit 130 can include fault detection circuitry configured to generate a fault signal at the fault terminal 136 in order to provide an indication of a fault status of the processing circuit 130. As an example, a fault comparator 448 can detect the differential output voltage of amplifier 414 and can flag a fault to fault delay logic 454 if the differential voltage is considered to be out of a specified range for the current sensing application in order to thereby detect an overcurrent condition as may be the result of a short circuit event. Fault delay logic 454 can be coupled to a driver 458 with which the fault signal is provided at fault terminal 136 in order to establish a minimum time period during which a fault must be present before the fault terminal 136 is latched.

Magnetic field signals generated by the sensing elements 106 and 102 are coupled to a dynamic offset cancellation circuit 412, which is further coupled to an amplifier 414. Dynamic offset cancellation circuit 412 may take various forms including chopping circuitry and may function in conjunction with offset control circuit 434 to remove offset that can be associated with the sensing elements 106 and 102 and/or the amplifier 414. For example, offset cancellation circuit 412 can include switches configurable to drive the magnetic field sensing elements (e.g., Hall plates) in two or more different directions such that selected drive and signal contact pairs are interchanged during each phase of the chopterminalg clock signal and offset voltages of the different driving arrangements tend to cancel.

A programming control circuit 422 is coupled between the VCC terminal 132 and EEPROM and control logic circuit 430 to provide appropriate control to the EEPROM and control logic circuit. EEPROM and control logic circuit 430 determines any application-specific coding and can be erased and reprogrammed using a pulsed voltage. A sensitivity control circuit 424 can be coupled to the amplifier 414 to generate and provide a sensitivity control signal to the amplifier 414 to adjust a sensitivity and/or operating voltage of the amplifier. The offset control circuit 434 can generate and provide an offset signal to a driver circuit 418 (which may be an amplifier) through a resistive network 426 to adjust the sensitivity and/or operating voltage of the driver circuit. Temperature compensation can be achieved using temperature data acquired from EEPROM and control logic circuit 430 via a temperature sensor 415 and perform necessary calculations to compensate for changes in temperature, if needed.

FIGS. 1-4 are schematic in nature and they are intended as an example only. Although processing circuitry 130, 140, and 340 are depicted as L-shapes disposed at the edges of the sensor die, it will be understood that they could be positioned anywhere on the sensor die. Furthermore, although not shown, bonding pads may be formed on the sensor die for connecting the processing circuitry 130, 140, and 340 to terminals 132-148 of sensor 100.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of elements can refer to either a direct or an indirect coupling, and a positional relationship between elements can be a direct or indirect positional relationship.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

As used throughout the disclosure, the phrase "substantially equal" shall mean "within +/−10% of being exactly equal". As used throughout the disclosure, the phrase "substantially perpendicular" shall mean "within +/−5 degrees of being exactly perpendicular". As used throughout the disclosure, the phrase "substantially parallel" shall mean "within +/−10 degrees of being exactly parallel". As used throughout the disclosure, the phrase "arranged at an angle of approximately 45 degrees" shall mean arranged at an angle that is equal to 45 degrees+/−5 degrees. As used throughout the disclosure, the phrase "substantially parallel" shall mean "within +/−10 degrees of being exactly parallel".

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A sensor, comprising:

a conductor including a first portion, a second portion, and a curved portion that is disposed between the first portion and the second portion, the curved portion being arranged to couple the first portion to the second portion, the curved portion being arranged to form a loop;

a first anchor magnetic field sensing element that is formed at an intersection of a first axis and a second axis that is substantially perpendicular to the first axis;

a first magnetic field sensing element that is formed on the first axis; and a second magnetic field sensing element that is formed on the second axis, wherein the first anchor magnetic field sensing element, the first magnetic field sensing element, and the second magnetic field sensing element are so positioned as to measure a level of electrical current through the conductor, wherein the first portion and the second portion are formed on a same side of the first anchor magnetic field sensing element, wherein the curved portion is routed around the first anchor magnetic field sensing element such that: (i) the curved portion crosses a first region of the first axis that is situated between the first anchor magnetic field sensing element and the first magnetic field sensing element, and (ii) the curved portion crosses a second region of the second axis that is situated between the first anchor magnetic field sensing element and the second magnetic field sensing element, and wherein the first anchor magnetic field sensing element is situated directly above or below an interior space that is at least in part enclosed by the curved portion.

2. The sensor of claim 1, comprising:

one or more first terminals;

one or more second terminals;

a first processing circuit configured to generate a first differential signal, the first differential signal being based on respective outputs of the first anchor magnetic field sensing element and the first magnetic field sensing element, the first differential signal being output on the one or more first terminals; and a second processing circuit configured to generate a second differential signal, the second differential signal being based on respective outputs of the first anchor magnetic field sensing element and the second magnetic field sensing element, the second differential signal being output on the one or more second terminals.

3. The sensor of claim 1, further comprising:

one or more terminals; and a processing circuitry that is configured to generate an output signal, the output signal being based on respective outputs of the first anchor magnetic field sensing element, the first magnetic field sensing element, and the second magnetic field sensing element, the output signal being indicative of a level of electrical current through the conductor, the output signal being output on the one or more terminals.

4. The sensor of claim 1, further comprising:

a third magnetic field sensing element that is formed on a third axis, the third axis being positioned between the first axis and the second axis, the third axis lying on the intersection of the first axis and the second axis, the third axis being arranged at an angle of approximately 45 degrees relative to both the first axis and the second axis.

5. The sensor of claim 4, comprising:

one or more first terminals;

one or more second terminals;

one or more third terminals;

a first processing circuit configured to generate a first differential signal, the first differential signal being based on respective outputs of the first anchor magnetic field sensing element and the first magnetic field sensing element, the first differential signal being output on the one or more first terminals; and a second processing circuit configured to generate a second differential signal, the second differential signal being based on respective outputs of the first anchor magnetic field sensing element and the second magnetic field sensing element, the second differential signal being output on the one or more second terminals; and a third processing circuit configured to generate a third differential signal, the third differential signal being based on respective outputs of the first anchor magnetic field sensing element and the third magnetic field sensing element, the third differential signal being output on the one or more third terminals.

6. The sensor of claim 5, further comprising:

a processing circuit that is configured to generate an output signal, the output signal being based on respective outputs of the first anchor magnetic field sensing element, the first magnetic field sensing element, the second magnetic field sensing element, and the third magnetic field sensing element, the output signal being indicative of a level of electrical current through the conductor, the output signal being output on the one or more first terminals.

7. The sensor of claim 1, further comprising a substrate, wherein the first anchor magnetic field sensing element, the first magnetic field sensing element, and the second magnetic field sensing element are formed on the substrate.

8. The sensor of claim 1, further comprising:

a second anchor magnetic field sensing element that is formed at the intersection of the first axis and the second axis;

a first substrate, wherein the first anchor magnetic field sensing element and the first magnetic field sensing element are formed on the first substrate; and a second substrate that is disposed above or below the first substrate, wherein the second anchor magnetic field sensing element and the second magnetic field sensing element are formed on the second substrate.

9. The sensor of claim 1, wherein each of the first anchor magnetic field sensing element, the first magnetic field sensing element, and the second magnetic field sensing element includes a planar Hall element.

10. The sensor of claim 1, wherein the loop has a U-shape or a C-shape.

11. A sensor, comprising:

one or more first terminals;

one or more second terminals;

a conductor including a first portion, a second portion, and a curved portion that is disposed between the first portion and the second portion, the curved portion being arranged to couple the first portion to the second portion;

a first anchor magnetic field sensing element that is formed at an intersection of a first axis and a second axis that is substantially perpendicular to the first axis;

a first magnetic field sensing element that is formed on the first axis; and a second magnetic field sensing element that is formed on the second axis;

wherein the first anchor magnetic field sensing element, the first magnetic field sensing element, and the second magnetic field sensing element are so positioned as to measure a level of electrical current through the conductor, wherein the curved portion is routed around the first anchor magnetic field sensing element, such that: (i) the curved portion crosses a first region of the first axis that is situated between the first anchor magnetic field sensing element and the first magnetic field sensing element, and (ii) the curved portion crosses a second region of the second axis that is situated between the first anchor magnetic field sensing element and the second magnetic field sensing element.

12. The sensor of claim 11, further comprising:

a third magnetic field sensing element that is formed on a third axis, the third axis being positioned between the first axis and the second axis, the third axis lying on the intersection of the first axis and the second axis, the third axis being arranged at an angle of approximately 45 degrees relative to both the first axis and the second axis.

13. The sensor of claim 11, further comprising a substrate, wherein the first anchor magnetic field sensing element, the first magnetic field sensing element, and the second magnetic field sensing element, are formed on the substrate.

14. The sensor of claim 11, further comprising:

one or more third terminals;

a third magnetic field sensing element that is formed on a third axis, the third axis being positioned between the first axis and the second axis, the third axis lying on the intersection of the first axis and the second axis, the third axis being arranged at an angle of approximately 45 degrees relative to both the first axis and the second axis; and a third processing circuit configured to generate a third differential signal, the third differential signal being based on respective outputs of the first anchor magnetic field sensing element, the third magnetic field sensing element, the third differential signal being output on the one or more third terminals.

15. The sensor of claim 11, wherein each of the first anchor magnetic field sensing element, the first magnetic field sensing element, and the second magnetic field sensing element includes a planar Hall element, the sensor further comprising:

a first processing circuit configured to generate a first differential signal, the first differential signal being based on respective outputs of the first anchor magnetic field sensing element and the first magnetic field sensing element, the first differential signal being output on the one or more first terminals; and a second processing circuit configured to generate a second differential signal, the second differential signal being based on respective outputs of the first anchor magnetic field sensing element and the second magnetic field sensing element, the second differential signal being output on the one or more second terminals.

16. The sensor of claim 1, wherein the curved portion defines a U-shape or a C-shape.

17. A sensor, comprising:

a first substrate;

a second substrate that is disposed above or below the first substrate;

a conductor including a first portion, a second portion, and a curved portion that is disposed between the first portion and the second portion, the curved portion being arranged to couple the first portion to the second portion;

a first anchor magnetic field sensing element that is formed on the first substrate, the first anchor magnetic field sensing element being formed at an intersection of a first axis and a second axis that is substantially perpendicular to the first axis;

a second anchor magnetic field sensing element that is formed on the second substrate, the second anchor magnetic field sensing element being formed at the intersection of the first axis and the second axis;

a first magnetic field sensing element that is formed on the first substrate, the first magnetic field sensing element being formed on the first axis;

a second magnetic field sensing element that is formed on the second substrate, the second magnetic field sensing element being formed on the second axis; and a semiconductor package that is configured to encapsulate, at least in part, the first substrate, the second substrate, the first anchor magnetic field sensing element, the second anchor magnetic field sensing element, the first magnetic field sensing element, the second magnetic field sensing element, and the conductor, wherein the first anchor magnetic field sensing element, the second anchor magnetic field sensing element, the first magnetic field sensing element, and the second magnetic field sensing element are so positioned as to measure a level of electrical current through the conductor, wherein the curved portion is routed around the first anchor magnetic field sensing element and the second anchor magnetic field sensing element, such that: (i) the curved portion crosses a first region of the first axis that is situated between the first anchor magnetic field sensing element and the first magnetic field sensing element, and (ii) the curved portion crosses a second region of the second axis that is situated between the second anchor magnetic field sensing element and the second magnetic field sensing element.

18. The sensor of claim 17, comprising:

one or more first terminals;

one or more second terminals;

a first processing circuit that is formed on the first substrate, the first processing circuit being configured to generate a first differential signal, the first differential signal being based on respective outputs of the first anchor magnetic field sensing element and the first magnetic field sensing element, the first differential signal being output on the one or more first terminals; and a second processing circuit that is formed on the second substrate, the second processing circuit configured to generate a second differential signal, the second differential signal being based on respective outputs of the second anchor magnetic field sensing element and the second magnetic field sensing element, the second differential signal being output on the one or more second terminals.

19. The sensor of claim 18, further comprising:

one or more third terminals;

a third magnetic field sensing element that is formed on one of the first and second substrates, the third magnetic field sensing element being formed on a third axis, the third axis being positioned between the first axis and the second axis, the third axis lying on the intersection of the first axis and the second axis, the third axis being arranged at an angle of approximately 45 degrees relative to both the first axis and the second axis; and a third processing circuit that is configured to generate a third differential signal, the third differential signal being based on respective outputs of the first anchor magnetic field sensing element, the third magnetic field sensing element, the third differential signal being output on the one or more third terminals.

20. The sensor of claim 18, wherein the curved portion defines a U-shape or a C-shape.

21. The sensor of claim 17, wherein each of the first anchor magnetic field sensing element, the second anchor magnetic field sensing element, the first magnetic field sensing element, and the second magnetic field sensing element includes a planar Hall element.

22. A sensor, comprising:

a conductor including a first portion, a second portion, and a curved portion that is disposed between the first portion and the second portion, the curved portion being arranged to couple the first portion to the second portion;

a first anchor magnetic field sensing element that is formed at an intersection of a first axis and a second axis that is arranged at a first angle relative to the first axis;

a first magnetic field sensing element that is formed on the first axis;

a second magnetic field sensing element that is formed on the second axis; and a semiconductor package that is configured to encapsulate the first anchor magnetic field sensing element, the first magnetic field sensing element, and the second magnetic field sensing element, wherein the first anchor magnetic field sensing element, the first magnetic field sensing element, and the second magnetic field sensing element are configured to measure a level of electrical current through the conductor, wherein the curved portion is routed around the first anchor magnetic field sensing element, such that: (i) the curved portion crosses a first region of the first axis that is situated between the first anchor magnetic field sensing element and the first magnetic field sensing element, and (ii) the curved portion crosses a second region of the second axis that is situated between the first anchor magnetic field sensing element and the second magnetic field sensing element.

23. The sensor of claim 22, wherein the first angle is approximately 90 degrees.

24. The sensor of claim 22, wherein the first angle is approximately 45 degrees.

25. The sensor of claim 22, wherein the conductor is at least partially encapsulated in the semiconductor package.

26. The sensor of claim 22, further comprising a third magnetic field sensing element that is formed on a third axis, the third axis passing through the intersection of the first and second axes, the third axis being arranged at a second angle relative to the first and second axes.

27. The system of claim 26, wherein the first angle is equal to approximately 90 degrees and the second angle is equal to approximately 45 degrees.

* * * * *